US006917255B2

(12) United States Patent
Mathias et al.

(10) Patent No.: US 6,917,255 B2
(45) Date of Patent: Jul. 12, 2005

(54) VIDEO BALUN

(75) Inventors: Bernd Mathias, Reutlingen (DE); Kevin J. Coster, New Milford, CT (US)

(73) Assignee: The Siemon Company, Watertown, CT (US)

( * ) Notice: Subject to any disclaimer, the term of this patent is extended or adjusted under 35 U.S.C. 154(b) by 0 days.

(21) Appl. No.: 10/465,295

(22) Filed: Jun. 18, 2003

(65) Prior Publication Data

US 2004/0041648 A1 Mar. 4, 2004

Related U.S. Application Data

(60) Provisional application No. 60/389,842, filed on Jun. 19, 2002.

(51) Int. Cl.[7] ........................... H03H 5/00; H01R 29/00

(52) U.S. Cl. ............................ 333/25; 333/26; 439/174

(58) Field of Search ...................... 333/25, 26; 439/174

(56) References Cited

U.S. PATENT DOCUMENTS 5,367,273 A * 11/1994 Georger et al. ................ 333/1
5,495,212 A 2/1996 DeCramer
5,793,265 A 8/1998 Spielman
6,100,772 A * 8/2000 Decramer et al. ............ 333/25
6,150,896 A * 11/2000 DeCramer et al. ............ 333/25

OTHER PUBLICATIONS

International Search Report, PCT/US03/19316, Jun. 18, 2003.

* cited by examiner

*Primary Examiner*—James H. Cho
(74) *Attorney, Agent, or Firm*—Cantor Colburn LLP

(57) ABSTRACT

An embodiment of the invention is a connection system for coupling an unbalanced transmission line to a balanced transmission line. The connection system includes a connector having a housing and a cover, an unbalanced line adapter, a transformer positioned within the housing having windings coupled to the unbalanced line adapter and connector contacts coupled to the windings. An outlet has a plurality of outlet contacts arranged in pairs, each pair of outlet contacts coupled to a balanced line. The outlet receives the connector to couple the connector contacts with the outlet contacts.

17 Claims, 6 Drawing Sheets

VIDEO BALUN

CROSS-REFERENCE TO RELATED APPLICATIONS

This application claims the benefit of U.S. provisional patent application No. 60/389,842 filed Jun. 19, 2002, the entire contents of which are incorporated herein by reference.

BACKGROUND OF THE INVENTION

The invention relates generally to baluns such as a balun for transmitting video signals between 75 ohm unbalanced cable and 100 ohm balanced cable. Video bandwidth increases to rise and currently ranges from 1 Mhz to 1.2 GHz. Existing cabling systems based on twisted pair cabling cannot effectively transmit the full range of video due to high attenuation and poor return loss of the twisted-pair cabling. In these installations, additional cabling components are installed (e.g., coaxial cable connectors) to provide for the full video bandwidth. This increases cost due to the need for separate connectors for varying applications.

SUMMARY OF THE INVENTION

An embodiment of the invention is a connection system for coupling an unbalanced transmission line to a balanced transmission line. The connection system includes a connector having a housing and a cover, an unbalanced line adapter, a transformer positioned within the housing having windings coupled to the unbalanced line adapter and connector contacts coupled to the windings. An outlet has a plurality of outlet contacts arranged in pairs, each pair of outlet contacts coupled to a balanced line. The outlet receives the connector to couple the connector contacts with the outlet contacts.

DETAILED DESCRIPTION

An embodiment of the invention is a balun for coupling a balanced transmission line to an unbalanced transmission line. Exemplary embodiments of the video balun may be used in a connector system such as that shown in U.S. Pat. No. 6,358,091, the entire contents of which are incorporated herein by reference.

Figure 1:
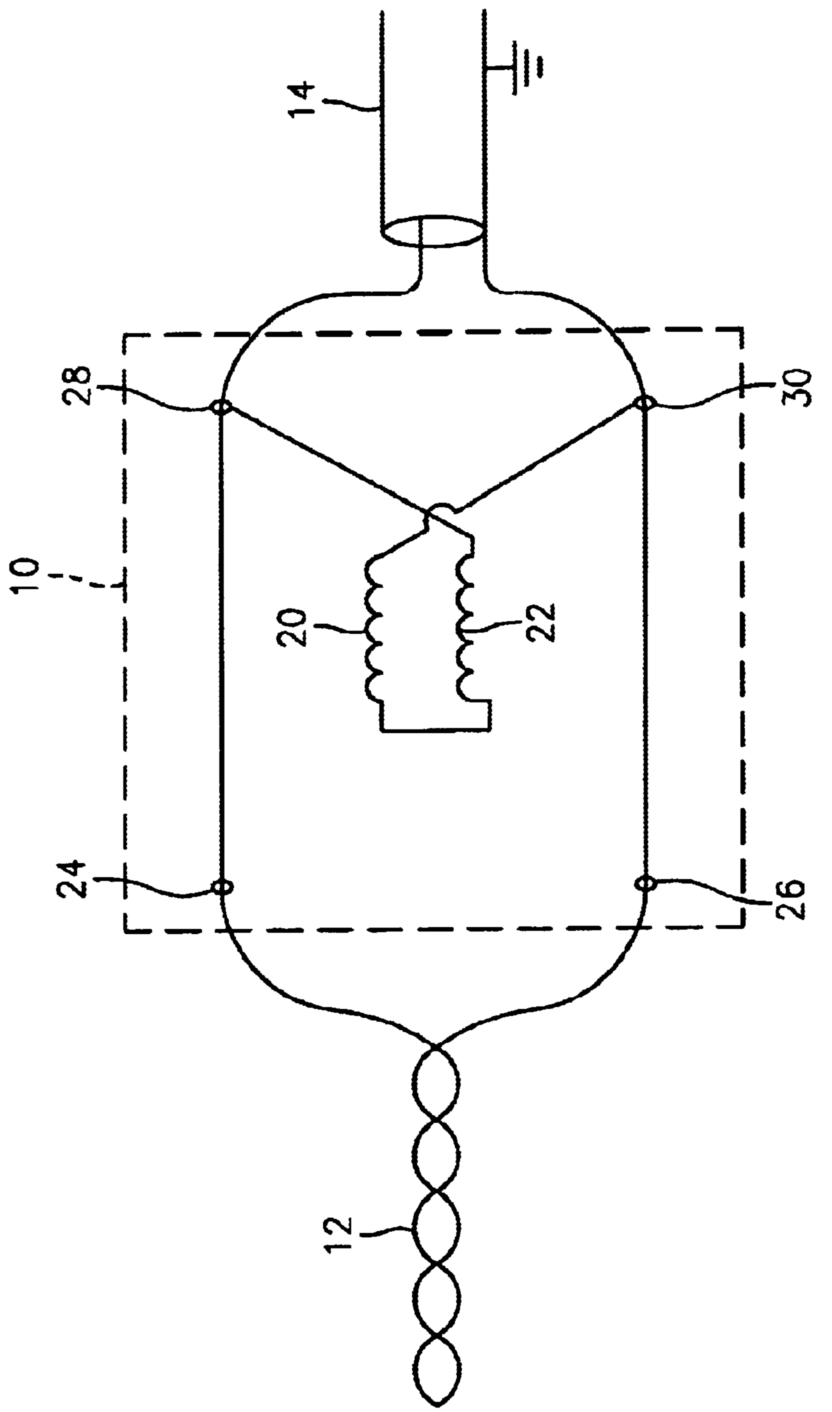
FIG. 1 is a schematic diagram of an exemplary balun.

FIG. 1 is a schematic diagram of the balun 10 installed between a balanced line 12 and an unbalanced line 14. Balun 10 includes an inductive element (e.g., transformer) having two windings 20 and 22. The transformer may be an unbalanced transformer made from a ferrite core and copper wire with an impedance ratio of 1:1.33. This impedance can be tuned for different cabling system nominal impedances. A first terminal 24 is connected to one conductor of a balanced line 12 and a second terminal 26 is connected to the other conductor of the balanced line 12. The first and second conductors of the balanced line 12 may correspond to tip and ring conductors of a twisted pair cable. A third terminal 28 is connected to a signal terminal of unbalanced line 14. A fourth terminal 30 is connected to an outer terminal of the unbalanced line 14. As shown in FIG. 1, the unbalanced line 14 may be a coaxial cable having a center terminal and an outer ground screen.

In an exemplary embodiment, balun 10 transforms video signals transmitted on 75 ohm coax cable 14 to balanced signals at a 100 ohm impedance level for transmission along a variety of 100 ohm balanced cables 12. Balanced line 12 may be a twisted pair of copper wires. Balun 10 may also be used to transform data signals transmitted on 100 ohm-balanced cable 12 to an unbalanced signal transmitted on 75-ohm coaxial cable 14. The balun converts video signals to balanced signals as well as data signals to unbalanced signals in order to transmit a variety of balanced and unbalanced signals from frequencies from 1 MHz to over 1.2 GHz.

Figure 2:
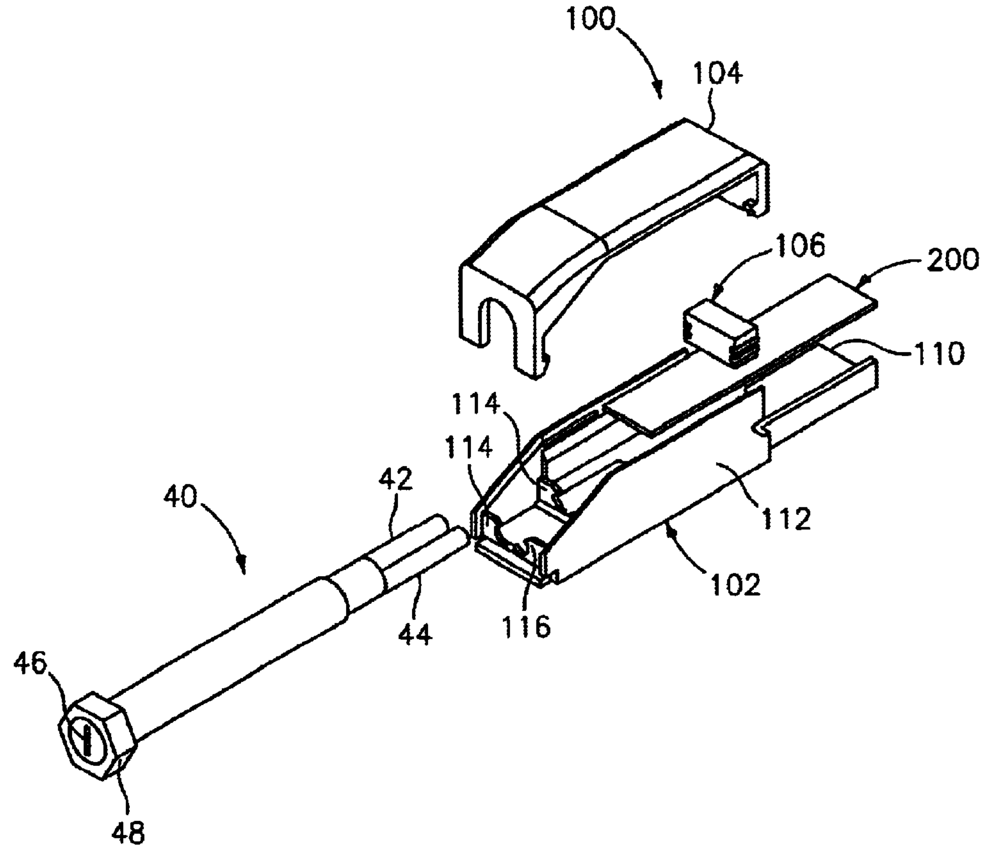
FIG. 2 is an exploded perspective view of a connector incorporating the balun of FIG. 1.

FIG. 2 is an exploded perspective view of a connector 100 incorporating the balun of FIG. 1. As noted above, the connector 100 may be similar to a two-pair connector disclosed in U.S. Pat. No. 6,358,091. The connector includes a housing 102 and a cover 104. The housing 102 is preferably conductive and may be die cast, metallized plastic, etc. The housing 102 includes a generally planar base 110 that support circuit board 200. Sidewalls 112 extend upward from base 110 and are substantially perpendicular to base 110. Two strain relief components 114 are provide in housing 102. Each strain relief component 114 includes a plurality of tines 116 that engage the jacket of line adapter 40 when the cover 104 is secured to housing 102. As described with reference to FIG. 4, the cover 104 includes a strain relief projection 108 to apply pressure on the jacket of line adapter 40 towards the tines 116.

Figure 3:
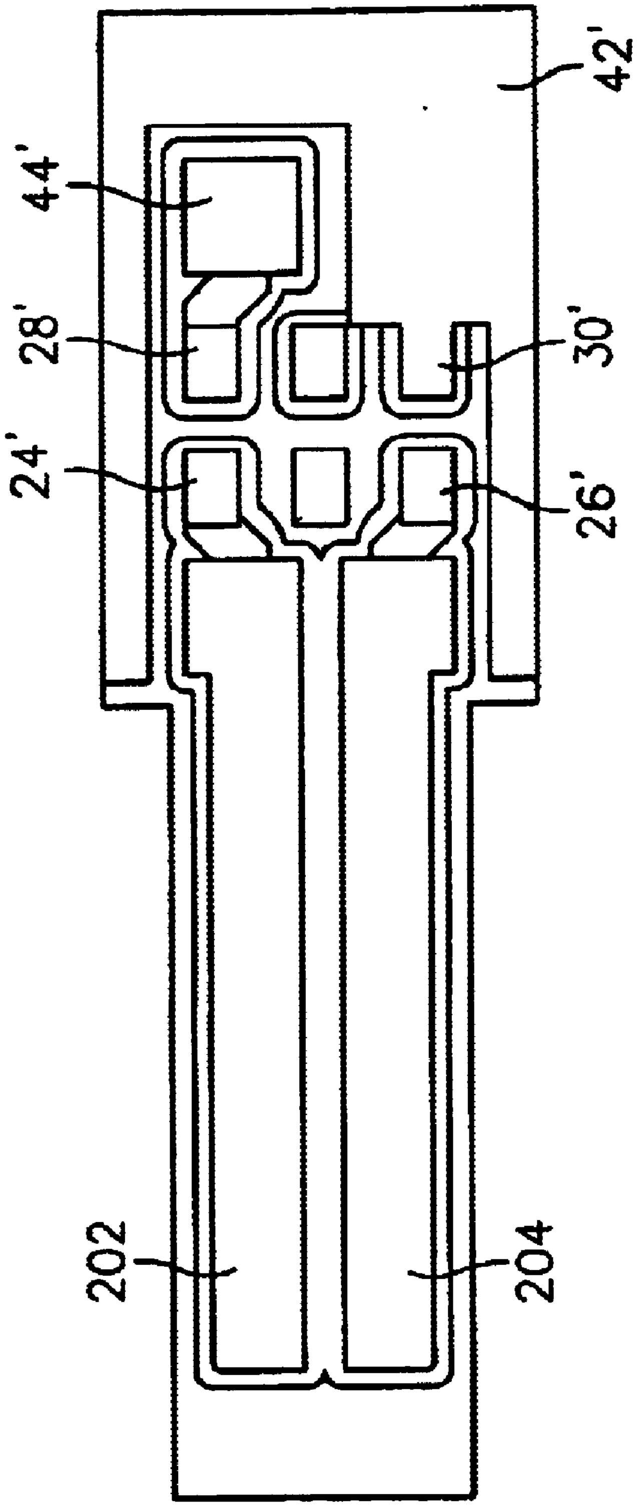
FIG. 3 depicts an exemplary circuit board.

The transformer 106 is mounted on a circuit board 200 having a layout as shown in FIG. 3. The unbalanced line adapter 40 includes two leads 44 and 42, corresponding to a signal lead and a ground lead respectively. The signal lead 44 is electrically connected to a center pin 46 of a coaxial connector and ground lead 42 is connected to the ground screen 48 of the coaxial connector.

Referring to FIG. 3, the circuit board 200 includes solder pads 24' and 26' for receiving first terminal 24 and second terminal 26 of transformer 106. Solder pads 28' and 30' receiving third terminal 28 and fourth terminal 30 of transformer 106. A signal solder pad 44' receives signal lead 44 and ground solder pad 42 receives ground lead 42. The ground solder pad 42' expands into a ground plane on both the top surface and bottom surface of circuit board 200. Upon assembly, the ground plane on the bottom of circuit board 200 contacts conductive housing 102. This allows the ground screen 48 of adapter 40 to be in electrical connection with conductive housing 102. The ground path is continued to an outlet when the connector 100 is mounted in an outlet such as that shown in FIG. 5. The conductive housing 102 makes electrical contact with a conductive outlet housing to continue the ground path. In an alternate embodiment, the circuit board 200 includes a surface mounted coaxial adapter rather than providing solder pads.

Circuit board 200 includes two connector contacts in the form of contact pads 202 and 204 for making electrical contact with outlet contacts in an outlet. Contact pad 202 is electrically connected to solder pad 24' and contact pad 204 is electrically connected to solder pad 26'.

Figure 4:
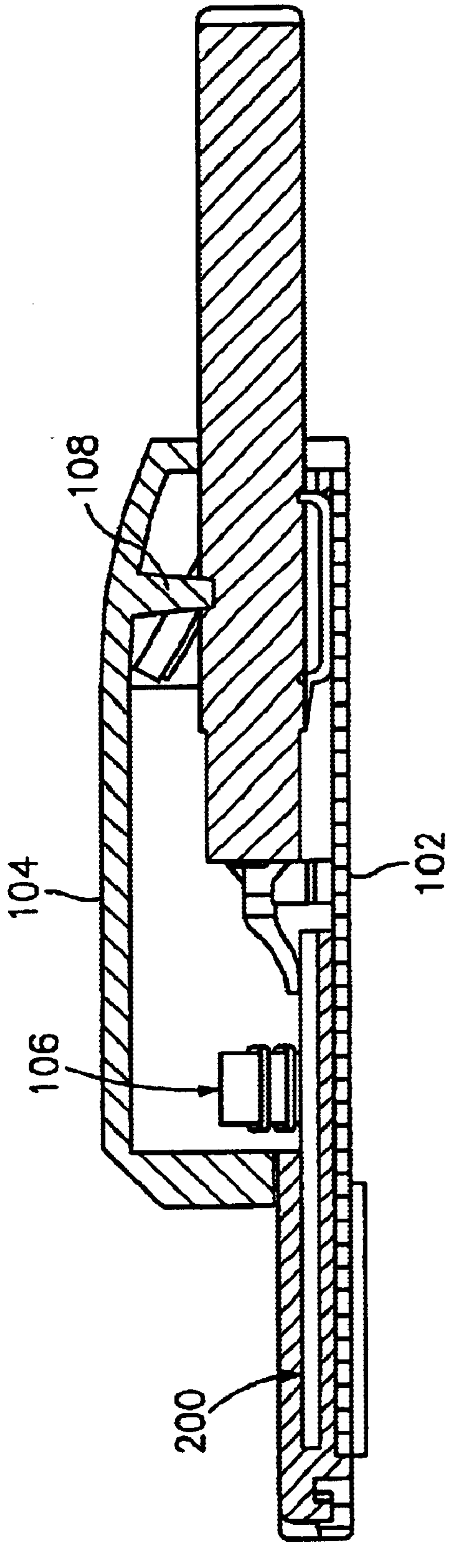
FIG. 4 is a cross-sectional view of the connector of FIG. 2.

FIG. 4 is a cross sectional view of connector 100 with adapter 40 terminated to the circuit board 200. Cover 104 includes a strain relief projection 108 that applies pressure to the jacket of adapter 40. Leads 44 and 42 are soldered to the circuit board at pads 44' and 42'. Alternatively, the circuit board 200 may include insulation displacement contacts for making electric connection with leads 44 and 42.

Figure 5:
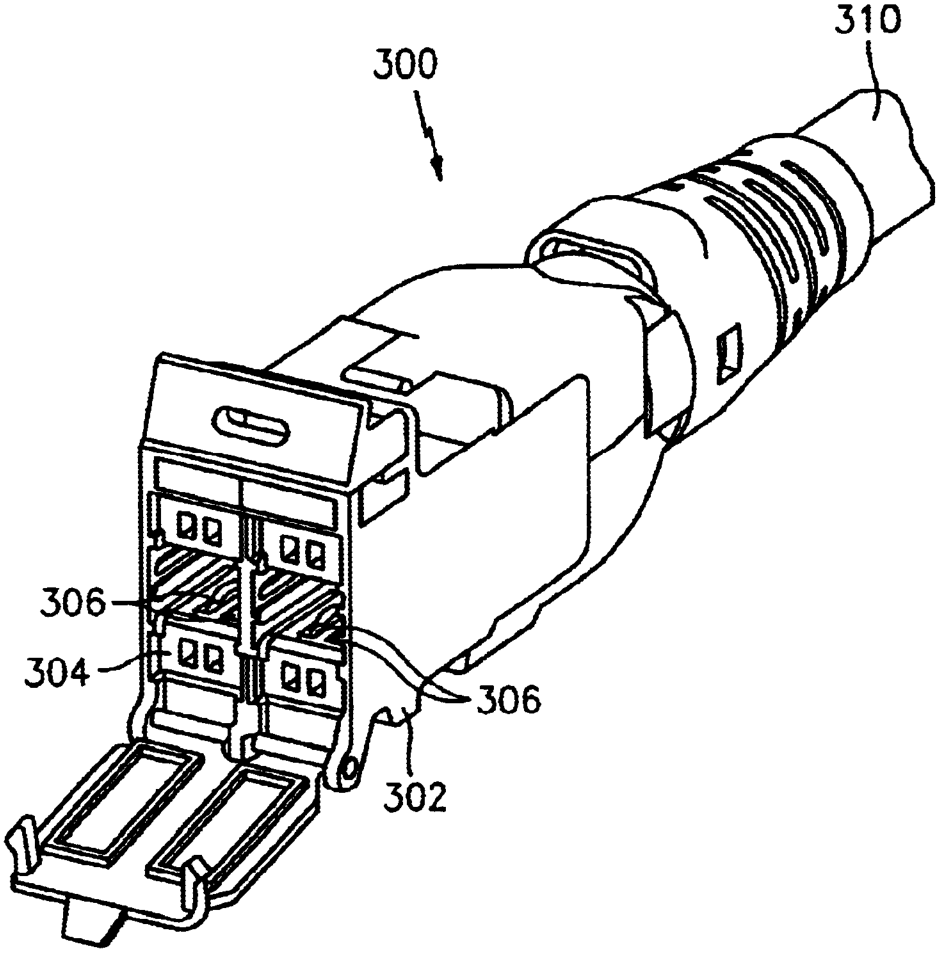
FIG. 5 is a perspective view of an outlet for receiving the connector of FIG. 2.

FIG. 5 depicts an exemplary outlet 300 for receiving connector 100. The outlet may be similar to that described in IEC standard 61076-3-104. The outlet 300 includes a conductive (e.g., die cast, metallized plastic) housing 302 including a plurality of insulative (e.g., plastic) contact carriers 304. Each contact carrier 304 includes two outlet contacts 306 connected to a balanced line in cabling 310. The contacts may be formed from any conductive metal. The cabling 310 includes four twisted wire pairs; a tip wire and ring wire from each pair being connected to contacts 306 in a common contact carrier 304. The wires in cabling 310 may be connected to the contacts 306 in a variety of manners (insulation displacement contacts, solder, etc.).

Figure 6:
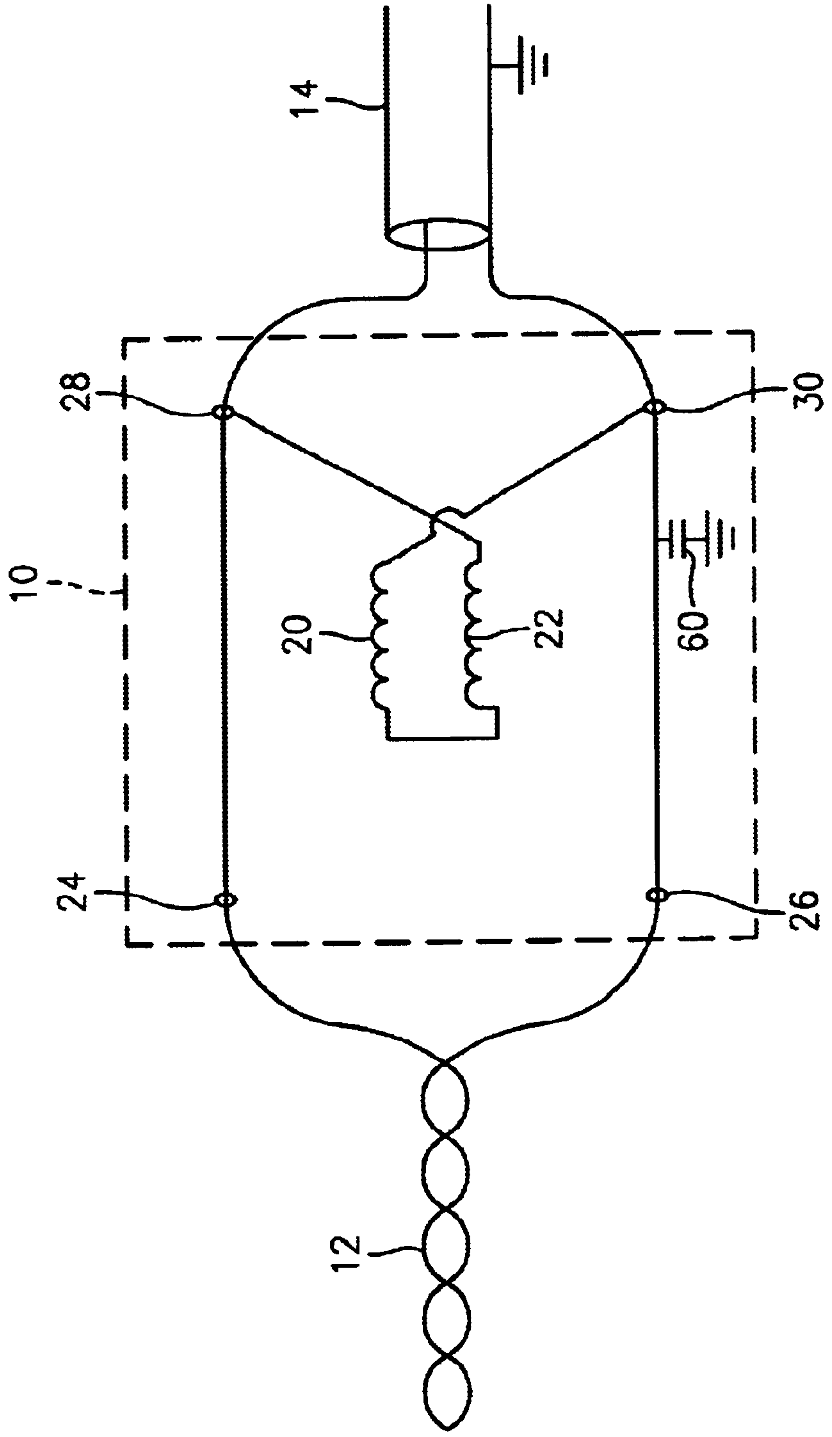
FIG. 6 is a schematic diagram of an exemplary balun in an alternate embodiment.

FIG. 6 is a schematic diagram of an exemplary balun in an alternate embodiment. This embodiment includes a capacitor 60 connecting the ground screen of the unbalanced line 14 to ground. Capacitor 60 provides isolation of DC signals.

The connector 100 is shielded, maintains impedance matching and proper isolation of signals from each other and outside interference. Connector 100 allows for easily installed cabling systems to route video signal with data and phone signals by utilizing one pair or two (for HDTV) pairs of a balanced cable. This allows easy consolidation of cabling in small networks with several different applications. Connector 100 mates with existing balanced cabling outlets such as that specified in IEC standard 61076-3-104. Thus, no additional hardware or cabling, other then connector 100, is necessary to couple the unbalanced line to the balanced line.

Another benefit is to reverse the application and use the connector 100 with existing coaxial cable to transmit data signals that initiate in 100-ohm balanced cable.

Consolidation of cabling is made uniform by keeping all hardware of the same type. Integration of the balun into the balanced cable system connector 100 and eliminating the high attenuation, high losses and balanced cable related performance problems are also beneficial. This leads to the ability to customize certain cord length due to eliminating the reflected signal found in stranded balanced cable.

While this invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A connection system for coupling an unbalanced transmission line to a balanced transmission line, the connection system comprising:

a connector having:

a housing and a cover;

a unbalanced line adapter;

a transformer positioned within said housing having windings coupled to said unbalanced line adapter;

connector contacts coupled to said windings, said connector contacts include two contact pads formed on said printed circuit board;

an outlet having a plurality of outlet contacts arranged in pairs, each pair of outlet contacts coupled to a balanced line, said outlet mating with said connector to place said contact pads in physical contact with said outlet contacts.

2. The connection system of claim 1 further comprising:

a printed circuit board within said connector, said transformer mounted to said printed circuit board, said unbalanced line adapter having two conductors coupled to said printed circuit board.

3. The connection system of claim 2 wherein:

said conductors are coupled to said printed circuit board through insulation displacement contacts.

4. The connection system of claim 2 wherein:

said conductors are soldered to said printed circuit board.

5. The connection system of claim 1 wherein:

said unbalanced line is a 75-ohm coaxial cable and said balanced line is a 100 ohm-twisted pair cable.

6. A connection system for coupling an unbalanced transmission line to a balanced transmission line, the connection system comprising:

a connector having:

a housing and a cover;

a unbalanced line adapter;

a transformer positioned within said housing having windings coupled to said unbalanced line adapter;

connector contacts coupled to said windings;

an outlet having a plurality of outlet contacts arranged in pairs, each pair of outlet contacts coupled to a balanced line, said outlet receiving said connector to couple said connector contacts with said outlet contacts;

a printed circuit board within said connector, said transformer mounted to said printed circuit board said unbalanced line adapter having two conductors coupled to said printed circuit board;

wherein said housing is conductive;

said printed circuit board having a ground plane coupled to said conductive housing.

7. The connection system of claim 6 wherein:

said outlet is conductive, said connector housing and said outlet making electrical contact.

8. A connection system for coupling an unbalanced transmission line to a balanced transmission line, the connection system comprising:

a connector having:

a housing and a cover;

a unbalanced line adapter;

a transformer positioned within said housing having windings coupled to said unbalanced line adapter;

connector contacts coupled to said windings;

an outlet having a plurality of outlet contacts arranged in pairs, each pair of outlet contacts coupled to a balanced line, said outlet receiving said connector to couple said connector contacts with said outlet contacts wherein:

said housing includes a strain relief component for engaging a jacket of said unbalanced line adapter.

9. The connection system of claim 8 wherein:

said cover includes a strain relief projection for pressing said jacket against said strain relief component.

10. A connector for coupling an unbalanced transmission line to a balanced transmission line, the connector comprising:

a housing and a cover;

a unbalanced line adapter;

a transformer positioned within said housing having windings coupled to said unbalanced line adapter;

connector contacts coupled to said windings, said connector contacts include two contact pads formed on said printed circuit board;

said contact pads being in physical contact with outlet contacts when said connector is mated with said outlet.

11. The connector of claim 10 further comprising:

a printed circuit board within said connector, said transformer mounted to said printed circuit board, said unbalanced line adapter having two conductors coupled to said printed circuit board.

12. The connector of claim 11 wherein:

said conductors are coupled to said printed circuit board through insulation displacement contacts.

13. The connector of claim 11 wherein:

said conductors are soldered to said printed circuit board.

14. The connector of claim 10 wherein:

said unbalanced line is a 75-ohm coaxial cable.

15. A connector for coupling an unbalanced transmission line to a balanced transmission line, the connector comprising:

a housing and a cover;

a unbalanced line adapter;

a transformer positioned within said housing windings coupled to said unbalanced line adapter;

connector contacts coupled to said windings for engaging outlet contacts;

a printed circuit board within said connector, said transformer mounted to said printed circuit board, said unbalanced line adapter having two conductors coupled to said printed circuit board wherein:

said housing is conductive;

said printed circuit board having a ground plane coupled to said conductive housing.

16. A connector for coupling an unbalanced transmission line to a balanced transmission line, the connector comprising:

a housing and a cover;

a unbalanced line adapter;

a transformer positioned within said housing having windings coupled to said unbalanced line adapter;

connector contacts coupled to said windings for engaging outlet contacts;

wherein:

said housing includes a strain relief component for engaging a jacket of said unbalanced line adapter.

17. The connector of claim 16 wherein:

said cover includes a strain relief projection for pressing said jacket against said strain relief component.

* * * * *